United States Patent
Kim et al.

(10) Patent No.: US 6,511,886 B2
(45) Date of Patent: Jan. 28, 2003

(54) METHOD FOR MANUFACTURING TRENCH-GATE TYPE POWER SEMICONDUCTOR DEVICE

(75) Inventors: Jong-dae Kim, Taejon (KR); Sang-gi Kim, Taejon (KR); Tae-moon Roh, Taejon (KR); Jin-gun Koo, Taejon (KR); Dae-woo Lee, Taejon (KR); Kyoung-ik Cho, Taejon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/032,629

(22) Filed: Dec. 26, 2001

(65) Prior Publication Data

US 2002/0081795 A1 Jun. 27, 2002

(30) Foreign Application Priority Data

Dec. 27, 2000 (KR) .............................. 00-82805

(51) Int. Cl.[7] .................. H01L 21/336; H01L 29/78
(52) U.S. Cl. ...................... 438/270; 257/330
(58) Field of Search ................. 438/270, 138, 438/589, 981, 424, 430, 268, 751, 723, 756, 724; 257/133, 332, 330, 327

(56) References Cited

U.S. PATENT DOCUMENTS

| | | | | |
|---|---|---|---|---|
| 4,645,564 A | * | 2/1987 | Morie et al. | 438/589 |
| 4,845,048 A | * | 7/1989 | Tamaki et al. | 438/270 |
| 4,992,390 A | * | 2/1991 | Chang | 437/42 |
| 5,780,353 A | * | 7/1998 | Omid-Zohoor | 438/433 |
| 6,423,618 B1 | * | 7/2002 | Lin et al. | 438/589 |

OTHER PUBLICATIONS

IEEE 1999, "2.5V–Driver Nch 3rd Generation Trench Gate MOSFET", A. Osawa, et al., 4 pages.*

* cited by examiner

*Primary Examiner*—Olik Chaudhuri
*Assistant Examiner*—Hoa B. Trinh
(74) *Attorney, Agent, or Firm*—Blakely Sokoloff Taylor & Zafman

(57) ABSTRACT

A method for manufacturing a trench-gate type power semiconductor device is provided. A drift region having a low concentration of a first conductivity type and a body region of a second conductivity type are formed on a semiconductor substrate having a high concentration of the first conductivity type. A trench is formed using a nitride layer pattern and a sidewall oxide layer formed at sidewalls of the nitride layer pattern as a mask, and then the sidewall oxide layer is removed. The corners of the trench are rounded by performing a heat treatment in a hydrogen atmosphere. A source region having a high concentration of the first conductivity type is formed using the nitride layer pattern as a mask. The nitride layer pattern is removed, and an upper oxide layer pattern is formed to cover a predetermined portion of the source region and the gate conductive layer. A body contact region of the second conductivity type is formed using the upper oxide layer pattern as a mask. A source electrode is formed to be electrically connected to the body contact region, and a drain electrode is formed to be electrically connected to the semiconductor substrate.

6 Claims, 5 Drawing Sheets

METHOD FOR MANUFACTURING TRENCH-GATE TYPE POWER SEMICONDUCTOR DEVICE

BACKGROUND OF THE INVENTION

1. Field of the Invention

The present invention relates to a method for manufacturing a power semiconductor device, and more particularly, to a method for manufacturing a trench-gate type power semiconductor device, which is simplified by using a smaller number of masks and exhibits improved characteristics.

2. Description of the Related Art

Trench-gate type power semiconductor devices are used in step motors, driving integrated circuits (ICs) of flat panel displays, or direct current to direct current (DC/DC) converters. Such trench-gate type power semiconductor devices have a high integration density and improved electrical characteristics, such as low on-resistance. However, in most cases, 5–6 masks are required to manufacture a trench-gate type power semiconductor device, and the manufacturing process is very complicated.

Due to the complicated manufacturing process, the characteristics of a device may deteriorate. For example, if an etching process, such as a reactive ion etching process, is performed to form a trench, the surface of a silicon substrate that is exposed by the trench is damaged. Next, if a gate oxide layer is formed on the damaged surface of the silicon substrate that is exposed by the trench, the state of the interface between the gate oxide layer and the surface of the silicon substrate deteriorates. In addition, spherical junctions are generated at each corner of the trench, and thus an electrical field is concentrated at the corners of the trench. Accordingly, the breakdown voltage of a device decreases, and thus the stability of the device also decreases.

SUMMARY OF THE INVENTION

To solve the above-described problems, it is an object of the present invention to provide a method for manufacturing a trench-gate type power semiconductor device which, by forming a sidewall oxide layer and using a self-alignment technique, requires a smaller number of masks and does not deteriorate the characteristics of a device.

Accordingly, to achieve the above object, there is provided a method for manufacturing a trench-gate type power semiconductor device. The method includes forming a drift region having a low concentration of a first conductivity type on a semiconductor substrate having a high concentration of the first conductivity type, forming an oxide layer on the drift region, forming a nitride layer pattern and a photoresist layer pattern that are sequentially stacked on the oxide layer, forming a body region of a second conductivity type in the drift region by implanting impurity ions of the second conductivity type using the nitride layer pattern and the photoresist layer pattern as an ion implantation mask, removing the photoresist layer pattern, forming a sidewall oxide layer at sidewalls of the nitride layer pattern, forming a trench perforating the body region by etching predetermined portions of the body region exposed by the nitride layer pattern and the sidewall oxide layer, partially exposing predetermined portions of the body region by removing the sidewall oxide layer, rounding the corners of the trench by performing a heat treatment in a hydrogen atmosphere, forming a gate oxide layer on the exposed portions of the body region and at the inner sidewalls of the trench, forming a gate conductive layer on the gate oxide layer to fill the trench, forming a source region having a high concentration of the first conductivity type along the upper edges of the trench in the body region by implanting impurity ions of the first conductivity type using the nitride layer pattern as an ion implantation mask, forming an upper oxide layer pattern to cover a portion of the source region and the gate conductive layer, removing the nitride layer pattern, forming a body contact region of the second conductivity type in a predetermined portion of the body region by implanting impurity ions of the second conductivity type using the upper oxide layer pattern as an ion implantation mask, forming a source electrode to be electrically connected to the body contact region and the source region, and forming a drain electrode to be electrically connected to the semiconductor substrate.

Preferably, the etching process used to form the trench is a reactive ion etching process.

Preferably, the heat treatment is performed in a hydrogen atmosphere at a temperature of 900–1000° C.

Preferably, the upper oxide layer pattern is formed of an $O_3$-TEOS oxide layer.

Preferably, forming the upper oxide layer pattern includes forming an upper oxide layer on the entire surface of the semiconductor substrate, and forming the upper oxide layer pattern by etching back the upper oxide layer to expose the top surface of the nitride layer pattern.

The method for manufacturing a trench-gate type power semiconductor device may further include performing a sacrificial oxidation process after forming the trench.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 1:
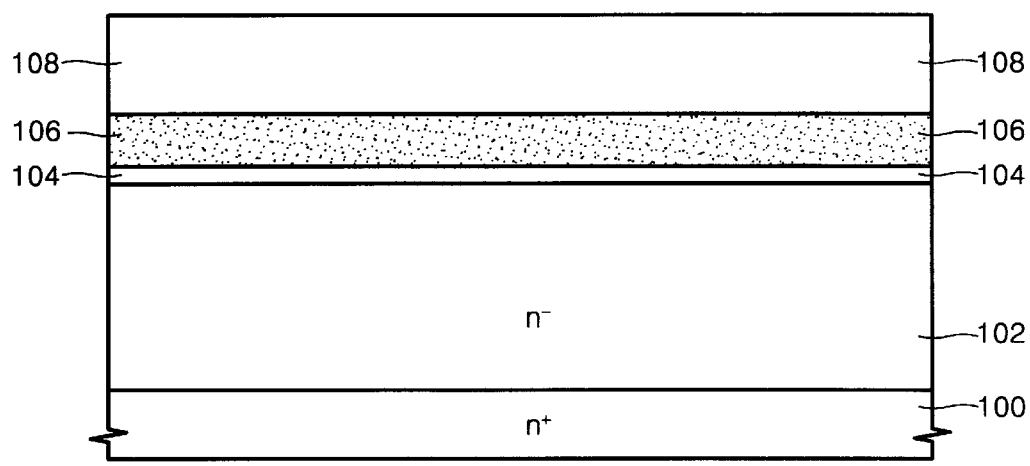
FIGS. 1 through 9 are cross-sectional views illustrating a method for manufacturing a trench-gate type power semiconductor device according to the present invention.

Referring to FIG. 1, an n⁻-type epitaxial layer 102 is formed on an n+-type semiconductor substrate 100. The n⁻-type epitaxial layer 102 is used as a drift region. An oxide layer 104, a nitride layer 106, and a photoresist layer 108 are sequentially formed on the n⁻-type epitaxial layer 102. The oxide layer 104 is thinly formed, and the nitride layer 106 is formed to a thickness of about 2000–4000 Å.

Figure 2:
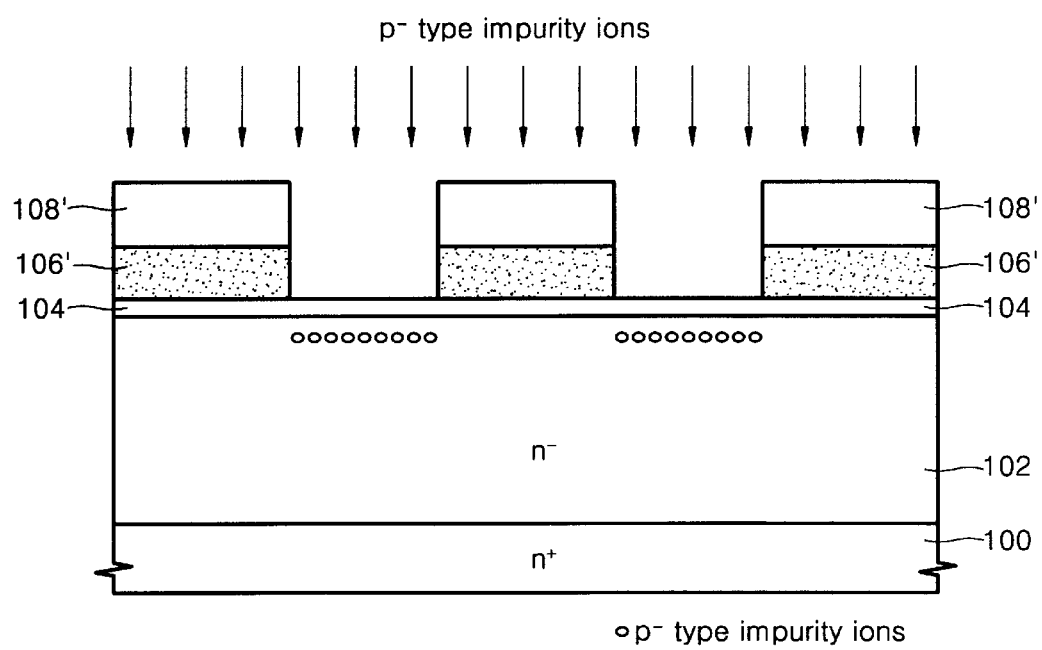

Referring to FIG. 2, the photoresist layer 108 and the nitride layer 106 of FIG. 1 are sequentially patterned using a first mask layer pattern (not shown) to form a trench, thereby forming nitride layer patterns 106' and photoresist layer patterns 108', respectively, to expose predetermined portions of the surface of the oxide layer 104. Next, p-type impurity ions, such as boron (B) ions, are implanted into the n⁻-type epitaxial layer 102 to a concentration of about $1 \times 10^{12} - 5 \times 10^{12}$ atoms/cm² using the nitride layer patterns 106' and the photoresist layer patterns 108' as masks. Next, the photoresist layer patterns 108' are removed.

Figure 3:
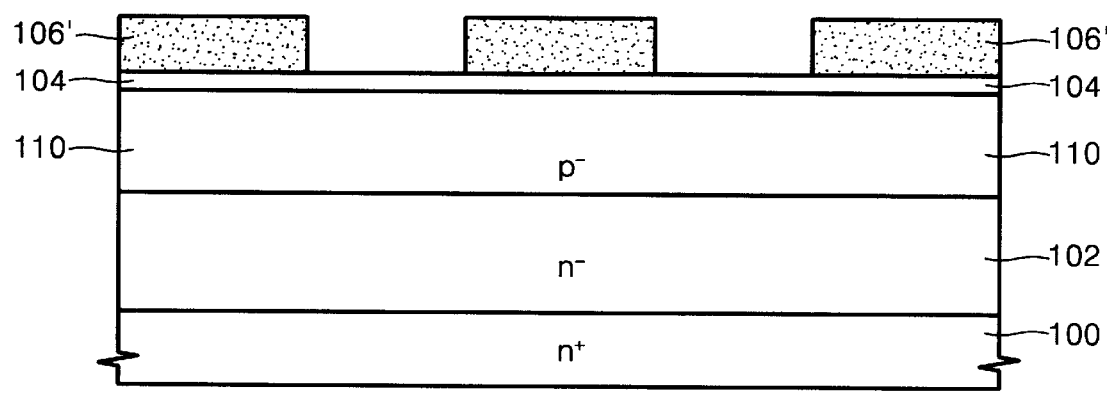

Referring to FIG. 3, the p-type impurity ions (boron ions), which are implanted into the n⁻-type epitaxial layer 102, are drive-in-diffused at a temperature of about 1150° C., thereby forming a p⁻-type body region 110.

Figure 4:
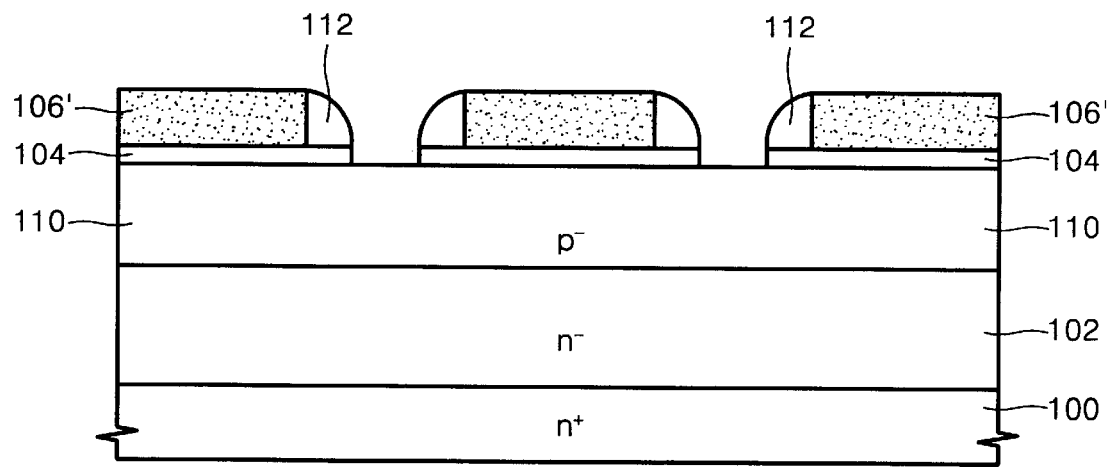

Referring to FIG. 4, a sidewall oxide layer 112 is formed at sidewalls of each of the nitride layer patterns 106'. The sidewall oxide layer 112 is formed of a tetraethylorthosilicate (TEOS) oxide layer to a thickness of about 2000–5000 Å. In order to form the sidewall oxide layer 112, an oxide layer is formed on the entire surface of the n$^+$-type semiconductor substrate 100, on which the p$^-$-type body region 110 is already formed. Next, the oxide layer positioned on the nitride layer patterns 106' and exposed portions of the surface of the p-type body region 110 is removed by etch back, thereby forming the sidewall oxide layer 112 at the sidewalls of each of the nitride layer patterns 106'.

Figure 5:
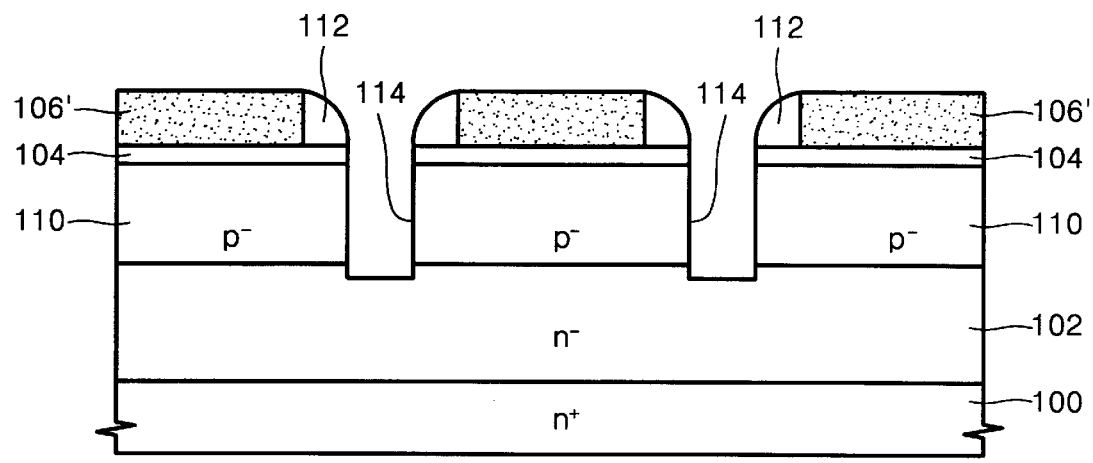

Referring to FIG. 5, a trench 114 is formed perforating the p$^-$-type body region to a predetermined depth of the n$^-$-type epitaxial layer 102 by an etching process using the nitride layer patterns 106' and the sidewall oxide layer as etching masks. The etching process may be a reactive ion etching (RIE) process.

Figure 6:
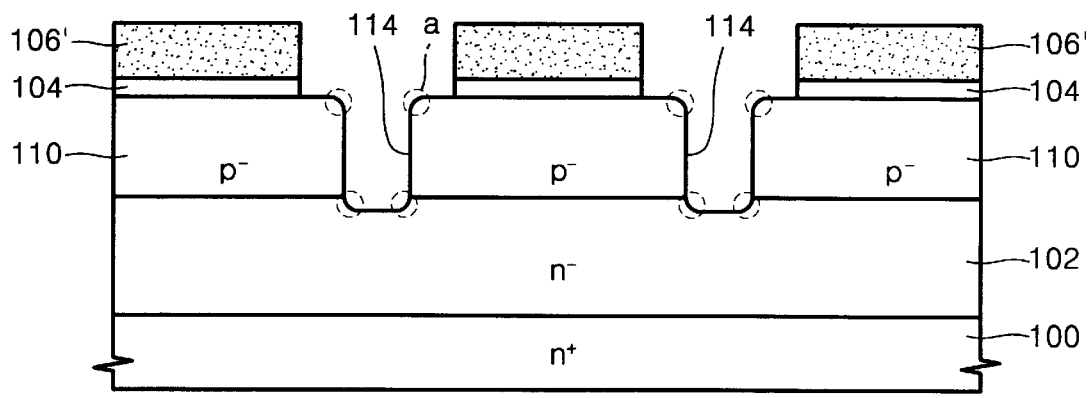

Referring to FIG. 6, the sidewall oxide layer 112 of FIG. 5 is removed. During the removal of the sidewall oxide layer 112, the oxide layer 102 under the sidewall oxide layer 112 is partially removed along with the sidewall oxide layer 112 such that the surface of the p$^-$-type body region 110 is partially exposed. Next, upper and lower corners 'a' of the trench 114 are rounded in a heat treatment performed in a hydrogen atmosphere at a temperature of about 900–1000° C. Next, damaged portions of the surface of the trench 114 are cured by a typical sacrificial oxidation process. In other words, a sacrificial oxide layer (not shown) is grown to a thickness of about 500 Å on the surface of the trench 114 and then is removed.

Figure 7:
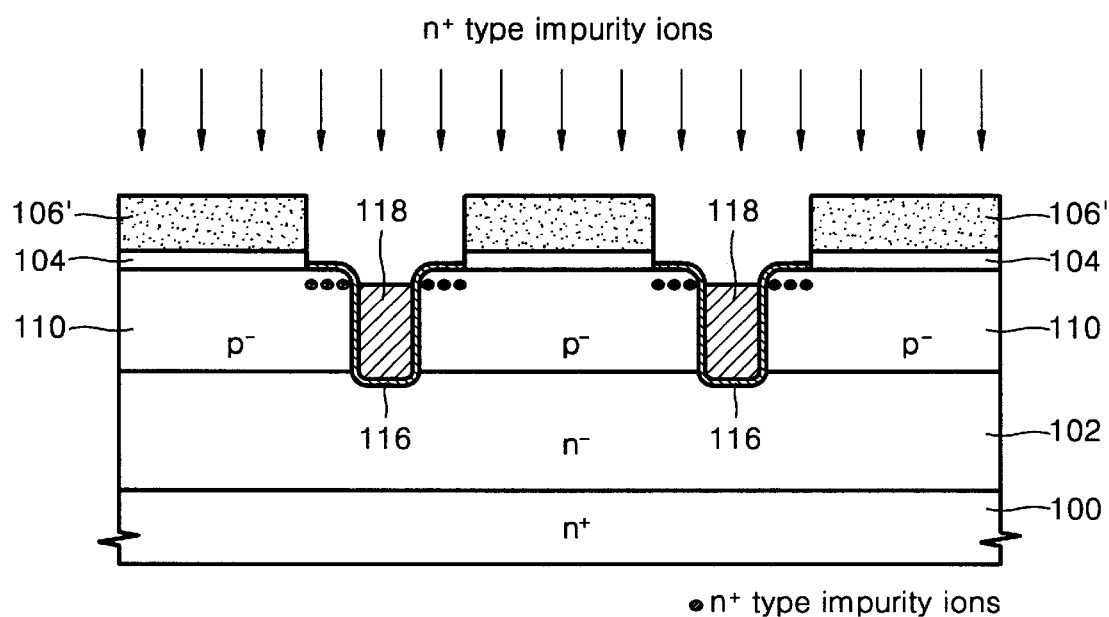

Referring to FIG. 7, a gate oxide layer 116 is formed on the exposed portions of the surface of the p$^-$-type body region 110 and at sidewalls of the trench 114. The gate oxide layer 116 is grown to a thickness of about 500 Å at a temperature of about 900–1000° C. Next, a gate conductive layer (not shown) is formed on the n$^-$-type semiconductor substrate 100, on which the gate oxide layer 116 is already formed, and is etched using a second mask layer pattern (not shown) as an etching mask, thereby forming a gate conductive layer pattern 118 filling the trench 114. Since the second mask layer pattern exposes the gate conductive layer, except for predetermined portions of the gate conductive layer at gate contact regions positioned at the edges of a device, the predetermined portions of the gate conductive layer are not removed along with other portions of the conductive layer. Next, n-type impurity ions, such as arsenic (As) ions, are implanted into the p$^-$-type body region 110 to a high concentration of about 5×10$^{15}$ atoms/cm$^2$ using the nitride layer patterns 106' as an ion implantation mask.

Figure 8:
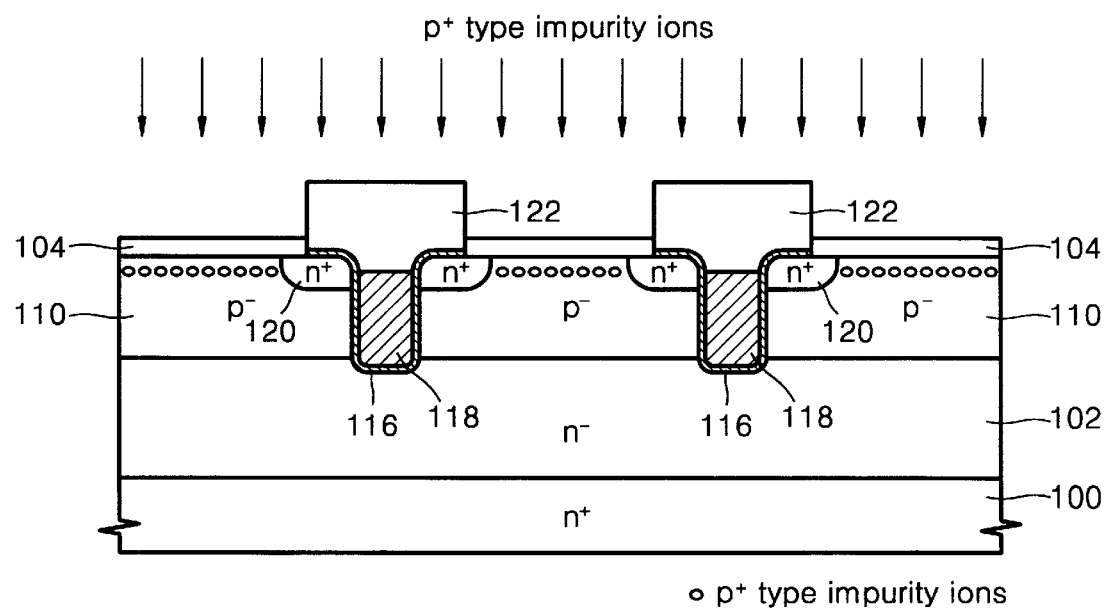

Next, referring to FIG. 8, the n-type impurity ions (arsenic ions) that are implanted are drive-in-diffused, thereby forming an n$^+$-type source region 120. The drive-in-diffusion process may also be performed later. Next, an O$_3$-TEOS oxide layer is formed to a thickness of about 3000–5000 Å on the entire surface of the n$^+$-type semiconductor substrate 100, on which the n$^+$-type source region 120 is already formed, and then is etched by etch back to expose the top surfaces of the nitride layer patterns 106' of FIG. 7 such that O$_3$-TEOS oxide layer patterns 122 are formed between the nitride layer patterns 106'.

Next, the nitride layer patterns 106' are removed. Next, p$^+$-type impurity ions are implanted into the p$^-$-type body region 110 to a high concentration of about 2×10$^{15}$–3×10$^{15}$ atoms/cm$^2$ using the O$_3$-TEOS oxide layer patterns 122 as an ion implantation mask.

Figure 9:
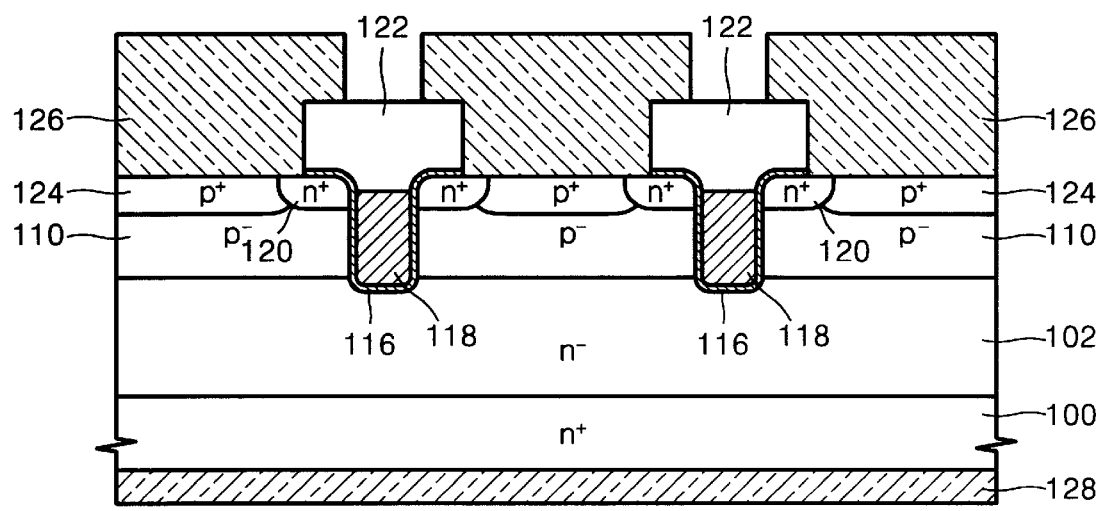

Referring to FIG. 9, the p$^+$-type impurity ions that are implanted are drive-in-diffused, thereby forming p$^+$-type body contact regions 124. After the formation of the p$^+$-type body contact regions 124, the oxide layer 102 of FIG. 8 is removed. Next, a metal layer, such as an aluminum layer, is deposited on the n$^+$-type semiconductor substrate 100 and is etched using a third mask layer pattern (not shown) as an etching mask to form an electrode, thereby forming source electrodes 126. At the same time, gate electrodes (not shown) are formed at gate contact regions positioned at the edges of a device. Next, a drain electrode 128 is formed by depositing a metal layer at the bottom of the n$^+$-type semiconductor substrate 100.

As described above, the method for manufacturing a trench-gate type power semiconductor device can provide the following advantages.

First, the number of mask layer patterns required is reduced from 5–6 in the prior art to 3 in the present embodiment. Thus, it is possible to perform the manufacturing process more easily and reduce the manufacturing costs.

Second, a self-alignment method is employed instead of additionally using mask layer patterns. Thus, it is possible to increase the integration density of a device.

Thirdly, the upper and lower corners of a trench are rounded in a heat treatment performed in a hydrogen atmosphere. Thus, the concentration of an electric field at the upper and lower corners of the trench can be alleviated, and accordingly, it is possible to enhance the reliability of a device by increasing the breakdown voltage of the device.

Fourth, since the corners of the trench are rounded, it is possible to form a gate oxide layer having a uniform thickness along the surface of the trench, and thus it is possible to improve the leakage current characteristics of a device.

What is claimed is:

1. A method for manufacturing a trench-gate type power semiconductor device, the method comprising.

forming a drift region having a low concentration of a first conductivity type on a semiconductor substrate having a high concentration of the first conductivity type;

forming an oxide layer on the drift region;

forming a nitride layer pattern and a photoresist layer pattern that are sequentially stacked on the oxide layer;

forming a body region of a second conductivity type in the drift region by implanting impurity ions of the second conductivity type using the nitride layer pattern and the photoresist layer pattern as an ion implantation mask;

removing the photoresist layer pattern;

forming a sidewall oxide layer at sidewalls of the nitride layer pattern;

forming a trench perforating the body region by etching predetermined portions of the body region exposed by the nitride layer pattern and the sidewall oxide layer partially exposing predetermined portions of the body region by removing the inner sidewall oxide layer;

rounding the corners of the trench by performing a heat treatment in a hydrogen atmosphere;

forming a gate oxide layer on the exposed portions of the body region and at the inner sidewalls of the trench;

forming a gate conductive layer on the gate oxide layer to fill the trench;

forming a source region having a high concentration of the first conductivity type along the upper edges of the trench in the body region by implanting impurity ions of the first conductivity type using the nitride layer pattern as an ion implantation mask, forming an upper oxide layer pattern to cover a portion of the source region and the gate conductive layer;

removing the nitride layer pattern;

forming a body contact region of the second conductivity type in a predetermined portion of the body region by implanting impurity ions of the second conductivity type using the upper oxide layer pattern as an ion implantation mask;

forming a source electrode to be electrically connected to the body contact region and the source region; and forming a drain electrode to be electrically connected to the semiconductor substrate.

2. The method of claim 1, wherein the etching process used to form the trench is a reactive ion etching process.

3. The method of claim 1, wherein the heat treatment is performed in a hydrogen atmosphere at a temperature of 900–1000° C.

4. The method of claim 1, wherein the upper oxide layer pattern is formed of an $O_3$-TEOS oxide layer.

5. The method of claim 1, wherein forming the upper oxide layer pattern comprises:

forming an upper oxide layer on the entire surface of the semiconductor substrate; and forming the upper oxide layer pattern by etching back the upper oxide layer to expose the top surface of the nitride layer pattern.

6. The method of claim 1 further comprising performing a sacrificial oxidation process after forming the trench.

* * * * *